(12) United States Patent
Park

(10) Patent No.: US 8,569,936 B2
(45) Date of Patent: Oct. 29, 2013

(54) PIEZOELECTRIC RESONATOR AND ELECTRODE STRUCTURE THEREOF

(75) Inventor: Jang Ho Park, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 81 days.

(21) Appl. No.: 13/200,980

(22) Filed: Oct. 6, 2011

(65) Prior Publication Data

US 2012/0248944 A1    Oct. 4, 2012

(30) Foreign Application Priority Data

Mar. 31, 2011 (KR) ........................ 10-2011-0029191

(51) Int. Cl.
*H01L 41/08* (2006.01)

(52) U.S. Cl.
USPC .......................................... 310/364; 310/344

(58) Field of Classification Search
USPC .................................. 310/364, 346
See application file for complete search history.

(56) References Cited

U.S. PATENT DOCUMENTS

| 5,233,261 A * | 8/1993 | Wajid .............................. 310/364 |
| 5,325,012 A * | 6/1994 | Sato et al. ....................... 310/364 |
| 6,700,312 B2 * | 3/2004 | Iizuka et al. ................... 310/364 |
| 2008/0218559 A1 * | 9/2008 | Fujii et al. ........................ 347/68 |
| 2010/0079038 A1 | 4/2010 | Jeon et al. |
| 2010/0327703 A1 * | 12/2010 | Uetani et al. ................... 310/364 |

FOREIGN PATENT DOCUMENTS

| JP | 3903698 | 1/2007 |
| JP | 2008-42873 | 2/2008 |
| KR | 10-0956244 | 4/2010 |

* cited by examiner

*Primary Examiner* — Mark Budd

(57) ABSTRACT

There are provided a piezoelectric resonator and an electrode structure thereof. The piezoelectric resonator includes: a piezoelectric body oscillated according to an electrical signal; and first and second electrodes each including first and second electrode layers stacked on respective both surfaces of the piezoelectric body, wherein the first electrode layer includes one or more selected from the group consisting of chromium (Cr), nickel (Ni), titanium (Ti), and an alloy including any one thereof, the ratio of the thickness of the first electrode layer to the thickness of the first or second electrode is 3% to 30%; and the second electrode layer includes copper (Cu) or an alloy including copper (Cu), and the ratio of the thickness of the second electrode layer to the thickness of the first or second electrode is 70% to 97%.

16 Claims, 3 Drawing Sheets

PIEZOELECTRIC RESONATOR AND ELECTRODE STRUCTURE THEREOF

CROSS-REFERENCE TO RELATED APPLICATIONS

This application claims the priority of Korean Patent Application No. 10-2011-0029191 filed on Mar. 31, 2011, in the Korean Intellectual Property Office, the disclosure of which is incorporated herein by reference.

BACKGROUND OF THE INVENTION

1. Field of the Invention

The present invention relates to a piezoelectric resonator and an electrode structure of the piezoelectric resonator and, more particularly, to an electrode structure of a piezoelectric resonator which can be stably operated while satisfying requirements for both high reliability and low cost, and a piezoelectric resonator having the same.

2. Description of the Related Art

In general, a piezoelectric resonator has various applications, for example, in a frequency oscillator, a frequency regulator, a frequency converter, or the like. Such a piezoelectric resonator is provided using Quartz having excellent piezoelectric characteristics as a piezoelectric material, and here, Quartz serves as a stable mechanical oscillation generator.

Quartz used for piezoelectric application is artificially grown in a high pressure autoclave and cut based on a Quartz axis, and the size and shape of the Quartz to be manufactured in the form of wafer are determined in consideration of desired characteristics. Here, the Quartz is required to have low phase noise, a high quality (Q) value, and a low frequency change rate over a change in time and environment.

Here, the Q value indicates band selection characteristics in a resonator, a wave filter, an oscillator, or the like, and is also known as a coefficient of quality. The Q value is calculated as a ratio of center frequency to a 3 dB bandwidth, and as the Q value is increased, the oscillator has better frequency selection characteristics.

As an electrode structure used in a related art piezoelectric resonator, a dual-layered (or two-storied) type electrode structure has been used. Alternatively, a quadruple-layered (or four-storied) type electrode structure, including dual-layered type electrodes arranged in two rows, has been used.

As for a reduction in costs, when a piezoelectric resonator is manufactured by using a silver (Ag) electrode having good conductivity, rather than gold (Au), when an external thermal environment is changed, such as in a soldering process, an oscillation frequency of the piezoelectric resonator is changed. Such a changed frequency is recovered to the original frequency with the lapse of time. Thus, a product requiring a high precision frequency deviation such as for mobile phone radio frequency (RF) communication has previously used an Au electrode, while an Ag electrode has been used as a general purpose electrode.

In order to reduce a unit cost in the case of the use of a high-priced metal, a method for reducing the amount of Au and Ag used in electrodes by reducing the thickness thereof, or by changing a design of Quartz has been employed.

The cause of the frequency shifts due to thermal impacts on the piezoelectric resonator has not been sufficiently considered or studied to date, while Au and Ag have continued to be used as electrode materials in consideration of electrical conductivity, high mass effect, oxidization, and the like, in spite of their incurrence of a high cost.

SUMMARY OF THE INVENTION

An aspect of the present invention provides an electrode structure of a piezoelectric resonator capable of being stably operated while satisfying high reliability and a low price, and a piezoelectric resonator having the same.

According to an aspect of the present invention, there is provided a piezoelectric resonator including: a piezoelectric body oscillated according to an electrical signal; and first and second electrodes each including first and second electrode layers stacked on respective both surfaces of the piezoelectric body, wherein the first electrode layer includes at least one material selected from the group consisting of chromium (Cr), nickel (Ni), titanium (Ti), and alloys thereof, the ratio of the thickness of the first electrode layer to the thickness of the first or second electrode is 3% to 30%; and the second electrode layer includes copper (Cu) or an alloy including copper (Cu), and the ratio of the thickness of the second electrode layer to the thickness of the first or second electrode is 70% to 97%.

The alloy including copper (Cu) may include copper (Cu) and any one selected from the group consisting of gold (Au), manganese (Mn), nickel (Ni), zinc (Zn), aluminum (Al), tin (Sn), lead (Pb), and chromium (Cr).

An atomic ratio of copper (Cu) to the alloy including copper (Cu) may be 30% or less, or 60% or more.

The atomic ratio of copper (Cu) to the alloy including copper (Cu) may be 20% or less.

The atomic ratio of copper (Cu) to the alloy including copper (Cu) may be 90% or more.

The first and second electrodes may have a dual-layered electrode structure including a first layer formed of the first electrode layer and a second layer formed of the second electrode layer.

The ratio of the thickness of the first layer to the thickness of the first or second electrode may be 3% to 15%, and the ratio of the thickness of the second layer to the thickness of the first or second electrode may be 85% to 97%.

The respective first and second electrodes may have a structure in which the first and second electrode layers are repeatedly stacked in an alternate manner.

The first and second electrodes may have a quadruple-layered electrode structure including first and third layers constituting the first electrode layer and second and fourth layers constituting the second electrode layer.

The ratio of the thickness of the second layer to the thickness of the first or second electrode may be 17% to 80%, and the ratio of the thickness of the fourth layer to the thickness of the first or second electrode may be 17% to 80%.

According to another aspect of the present invention, there is provided a piezoelectric resonator including: a piezoelectric body oscillated according to an electrical signal; and first and second electrodes each including first and second electrode layers stacked on respective both surfaces of the piezoelectric body, wherein the first electrode layer includes first and third layers including at least one material selected from the group consisting of chromium (Cr), nickel (Ni), titanium (Ti), and alloys thereof, the ratio of the thickness of the first electrode layer to the thickness of the first or second electrode is 3% to 30%; and the second electrode layer a second layer including copper (Cu) or an alloy including copper (Cu) and a fourth layer including silver (Ag) or an alloy including silver (Ag), and the ratio of the thickness of the second electrode layer to the thickness of the first or second electrode is 70% to 97%.

According to another aspect of the present invention, there is provided an electrode structure of a piezoelectric resonator, including: first and second electrode layers stacked on main surfaces of a piezoelectric body, wherein the first electrode layer includes at least one material selected from the group consisting of chromium (Cr), nickel (Ni), titanium (Ti), and alloys of them, and the ratio of the thickness of the first electrode layer to the overall electrode thickness is 3% to 30%; and the second electrode layer includes copper (Cu) or an alloy including copper (Cu), and the ratio of the thickness of the second electrode layer to the overall electrode thickness is 70% to 97%.

The electrode structure may be a dual-layered electrode structure including a first layer formed of the first electrode layer and a second layer formed of the second electrode layer.

The electrode structure may be a structure in which the first and second electrode layers are alternately repeatedly stacked.

The electrode structure may be a quadruple-layered electrode structure including first and third layers constituting the first electrode layer and second and fourth layers constituting the second electrode layer.

According to another aspect of the present invention, there is provided an electrode structure of a piezoelectric resonator, including: first and second electrode layers stacked on main surfaces of a piezoelectric body, wherein the first electrode layer includes first and third layers including at least one material selected from the group consisting of chromium (Cr), nickel (Ni), titanium (Ti), and alloys of them, and the ratio of the thickness of the first electrode layer to the overall electrode thickness is 3% to 30%; and the second electrode layer includes a second layer including copper (Cu) or an alloy including copper (Cu) and a fourth layer including silver (Ag) or an alloy including silver (Ag), and the ratio of the thickness of the second electrode layer to the overall electrode thickness is 70% to 97%.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
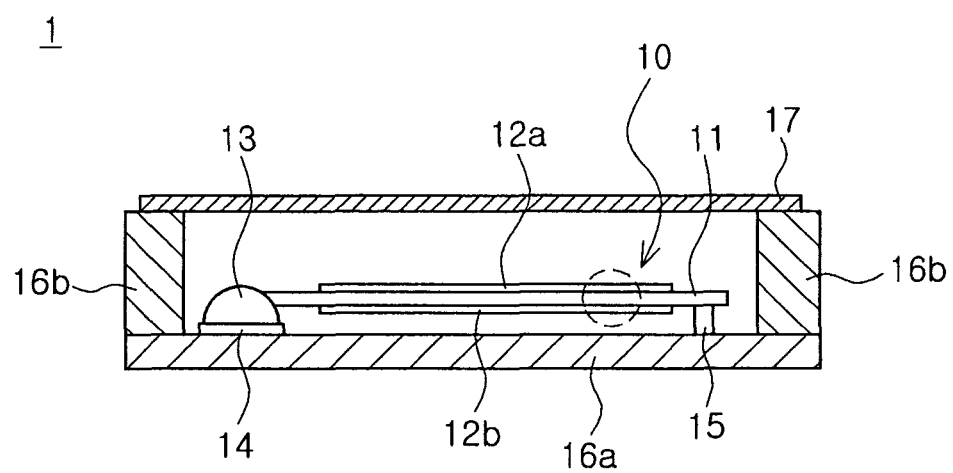
FIG. 1 is a schematic cross-sectional view of a piezoelectric resonator package according to an embodiment of the present invention.

Hereinafter, embodiments will be described in detail with reference to the accompanying drawings so that they can be easily practiced by those skilled in the art to which the present invention pertains. However, in describing the embodiments of the present invention, detailed descriptions of well-known functions or constructions are omitted so as not to obscure the description of the present invention with unnecessary detail.

In addition, like reference numerals denote parts performing similar functions and actions throughout the drawings.

Throughout this specification, unless explicitly described otherwise, "comprising" any components will be understood to imply the inclusion of other components but not the exclusion of any other components.

A piezoelectric resonator and an electrode structure of the piezoelectric resonator according to embodiments of the present invention will be described in detail with reference to FIGS. 1 to 4.

FIG. 1 is a schematic cross-sectional view of a piezoelectric resonator package according to an embodiment of the present invention. With reference to FIG. 1, a piezoelectric resonator 10 may include a piezoelectric body 11 including a piezoelectric plate and first and second electrodes 12a and 12b formed on respective both surfaces of the piezoelectric body 11. In particular, the first and second electrodes 12a and 12b may be respectively, symmetrically formed on both surfaces of the piezoelectric body 11. Accordingly, the piezoelectric resonator 10 may be formed to have a package structure as illustrated in FIG. 1.

The piezoelectric resonator package 1 may have a structure including a bottom layer 16a, an electrode pad 14 formed on the bottom layer 16a, the piezoelectric body 11 installed such that one side thereof is fixed on the electrode pad 14, and a bump 15 disposed between an upper face of the bottom layer 16a and the other side of the piezoelectric body 11.

Here, as mentioned above, the first and second electrodes 12a and 12b electrically connected with the electrode pad 14 may be formed on upper and lower surfaces of the piezoelectric body 11. A support layer 16b forming a space portion in which the piezoelectric body 11 may be formed on a circumferential portion of the bottom layer 16a. A lead 17 sealing the space portion may be disposed on the support layer 16b.

Figure 2:
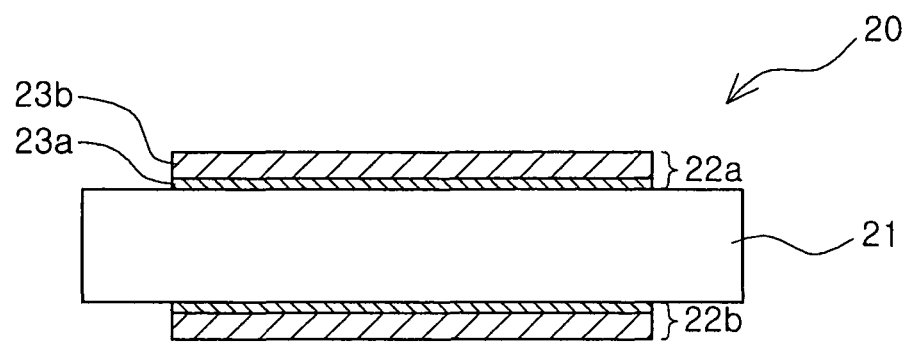
FIG. 2 is a schematic cross-sectional view showing a dual-layered type electrode structure of a piezoelectric resonator according to an embodiment of the present invention.
Figure 3:
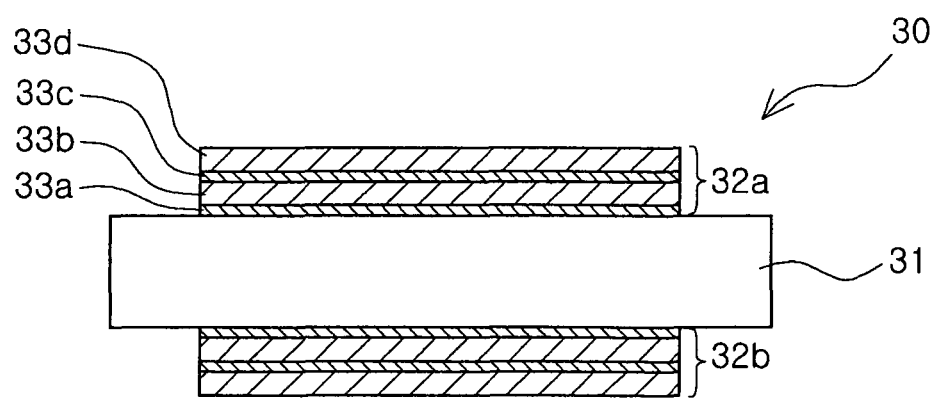
FIG. 3 is a schematic cross-sectional view showing a quadruple-layered type electrode structure of a piezoelectric resonator according to an embodiment of the present invention.

FIGS. 2 and 3 are enlarged views of the piezoelectric resonator 10 of FIG. 1. Specifically, FIG. 2 shows a piezoelectric resonator 20 having a dual-layered type electrode structure according to an embodiment of the present invention, and FIG. 3 shows a piezoelectric resonator 30 having a quadruple-layered type electrode structure according to an embodiment of the present invention.

The piezoelectric resonators 20 and 30 according to an embodiment of the present invention may include piezoelectric bodies 21 and 31 and first electrodes 22a and 32a and second electrodes 22b and 32b formed on upper and lower surfaces of the piezoelectric bodies 21 and 31, respectively.

The piezoelectric bodies 21 and 31 may generate a piezoelectric effect by an electrical signal, and a piezoelectric plate formed of $SiO_2$ may be used therefor, but the present invention is not limited thereto. Here, as the piezoelectric bodies 21 and 31, a Quartz wafer may be cut and processed.

The first electrodes 22a and 32a and the second electrodes 22b and 32b may provide an electrical signal to the piezoelectric bodies 21 and 31, may generate a piezoelectric effect on the piezoelectric bodies 21 and 31, or may serve to output an electrical signal due to the piezoelectric effect of the piezoelectric bodies 21 and 31. In this case, the first electrodes 22a and 32a and the second electrodes 22b and 32b may be formed by performing a process, such as deposition, on a material (to be described below) on the upper and lower surfaces of the piezoelectric bodies 21 and 31.

Incase of the piezoelectric resonator, as an equivalent series resistance (ESR) value is reduced, faster operation time characteristics can be implemented and a loss of power can be significantly reduced.

The ESR of the piezoelectric resonator may satisfy an equation shown below:

$$R = \rho \frac{L}{A} = \rho \frac{L}{Wt}$$

Here, $\rho$ is a resistivity value of a resistor element, A is an area of the resistor element, and L is a length of the resistor element. The ESR is proportional to the resistivity characteristics and the length of the resistor element and is in inverse proportion to the area of the resistor element.

In the ESR of the piezoelectric resonator, $\rho$ is an inherent resistivity value of an electrode material, W is a width of the electrode, t is a thickness of the electrode, and L is a length of the electrode.

Thus, in order to manufacture a piezoelectric resonator having a small ESR, a material having a low resistivity $\rho$ is to be selected, the length L of the electrode is to be shortened, or the width W of the electrode is to be increased.

When the thickness t of the electrode is relatively small, the ESR can be reduced but a deposition cost is increased. Also, the cost for a process of etching the electrode to precisely control frequency may be increased. In addition, as the thickness of the electrode is increased, mechanical oscillation characteristics of the piezoelectric body are degraded.

According to an embodiment of the present invention, the electrode thickness t of the piezoelectric resonator can be adjusted according to a desired natural frequency. The electrode thickness t of the piezoelectric resonator may be 1.0 μm or smaller and can be adjusted within the range of 0.2 μm to 0.4 μm according to a desired natural frequency, but the present invention is not limited thereto.

Thus, in order to implement a piezoelectric resonator having a relatively low ESR, the length L of the electrode may be relatively shortened or the width W of the electrode may be relatively increased.

Meanwhile, the length L and the width W of the electrode may be limited according to the size of a product and the shape of the piezoelectric body. Thus, in order to lower the ESR, a metal having a small resistivity p may be used as an electrode material.

According to an embodiment of the present invention, in order to implement a piezoelectric resonator having a low ESR, one or more of silver (Ag) and copper (Cu) having a relatively small resistivity value, among metals, may be used.

The electrode structure of the piezoelectric resonator will now be described in detail.

With reference to FIGS. 2 and 3 showing the electrode structure of the piezoelectric resonator according to an embodiment of the present invention, the electrode structure of the piezoelectric resonator may include piezoelectric bodies 21 and 31 oscillated by an electrical signal and first and second electrode layers which are formed on respective both surfaces of the piezoelectric bodies 21 and 31 and sequentially stacked.

The first electrode layer may include at least one material selected from the group consisting of chromium (Cr), nickel (Ni), titanium (Ti), and alloys thereof, and the second electrode layer may include copper (Cu) or an alloy including copper (Cu).

The ratio of the thickness of the first electrode layer to the first electrode or the second electrode is 3% to 30%, and the ratio of the thickness of the second electrode layer to the first electrode or the second electrode is 70% to 97%.

With reference to FIG. 2 showing the piezoelectric resonator according to an embodiment of the present invention, the piezoelectric resonator having a dual-layered electrode structure may include a first electrode 22a and a second electrode 22b having a structure in which a first layer 23a, a first electrode layer, and a second layer 23b, a second electrode layer, are sequentially stacked on the surface of the piezoelectric body 21.

When thermal expansion coefficient of the piezoelectric body 21 is different from those of the first and second electrodes 22a and 22b, there may be a difference in expansion and shrinkage due to a change in an external thermal environment after the electrodes are manufactured. Then, stress may be generated to cause a change in the oscillation frequency of the piezoelectric resonator.

Such a behavior is recovered to the original state with the lapse of time. Thus, due to such frequency change characteristics over time, the use of piezoelectric resonator is limited in a product which requires a high precision frequency.

However, according to an embodiment of the present invention, a material, which is able to significantly reduce the difference in thermal expansion coefficient between the electrodes and piezoelectric body, may be selected as a material of the electrodes, from among materials which may reduce the resistivity $\rho$ between the piezoelectric body and the electrode materials. Thus, a frequency variation according to a change in the thermal environment can be significantly reduced.

TABLE 1

| Metal | Thermal expansion coefficient ($10^{-6}$ mm/° C.) | Resistivity (nΩxm) |
|---|---|---|
| Cr | 8.4 | 125.0 |
| Au | 14.2 | 22.14 |
| Ni | 16.7 | 69.3 |
| Ag | 18.9 | 15.87 |
| Cu | 16.5 | 16.78 |
| SiO$_2$ (Piezoelectric body) | 13.7 | — |

With reference to Table 1 above, it is noted that the difference in the thermal expansion coefficient between copper (Cu) and the piezoelectric body (SiO$_2$) is relatively small compared with other metals such as silver (Ag). Namely, when copper (Cu) is used as a material of the electrodes, a frequency change rate due to the difference in the thermal expansion coefficient can be significantly reduced.

Also, an electrode formed of copper (Cu) or a copper alloy has excellent electrical conductivity, so copper (Cu) can be used as a substitute of silver (Ag) or gold (Au), and since copper (Cu) is a low-priced metal as compared with silver (Ag) or gold (Au), the overall manufacturing cost can be reduced.

According to an embodiment of the present invention, a low-priced piezoelectric resonator may be implemented while reducing a generation of stress between the piezoelectric plate and the electrodes due to a change in a thermal environment. Also, a time required for manufacturing a product can be shortened by significantly reducing the difference in a frequency variation over time.

According to an embodiment of the present invention, in order to reduce the frequency variation characteristics, an electrode layer including any one selected from the group consisting of copper (Cu) and a copper alloy is manufactured to have a multi-layered electrode structure on the piezoelectric body, thus reducing thermal stress between the piezoelectric plate and the first electrode or the second electrode.

With reference to FIG. 2 showing the dual-layered type electrode structure according to an embodiment of the present invention, the first electrode 22a and the second electrode 22b may be formed to include the first layer 23a, the first electrode layer, including at least one material selected from the group consisting of chromium (Cr), nickel (Ni), titanium (Ti), or alloys thereof, and the second layer 23b, the second electrode layer, formed of copper (Cu) or a copper alloy, respectively.

The first layer 23a serves to enhance adhesive strength between the piezoelectric body 21 and the first electrode 22a or the second electrode 22b. According to an embodiment of the present invention, a material which is stable and has excellent electrical conductivity with low resistivity may be used to form the first layer 23a. For example, at least one material selected from the group consisting of chromium (Cr), nickel (Ni), titanium (Ti), or alloys thereof, may be used, And preferably, chromium (Cr) or nickel (Ni)-chromium (Cr) may be used.

The second layer 23b may be formed of a material which provides electrical conductivity and significantly reduces the difference in the thermal expansion coefficient between the first electrode 22a or the second electrode 22b and the piezoelectric body 21 to lower the frequency change rate due to thermal stress. According to an embodiment of the present invention, copper (Cu) or an alloy including copper which is low-priced and has a small difference in the thermal expansion coefficient from the piezoelectric body 21 may be used.

When the copper alloy is used, a metal material not degrading the conductivity of the copper itself may be used as an additional material of the copper alloy. For example, any one selected from the group consisting of silver (Ag), gold (Au), manganese (Mn), nickel (Ni), zinc (Zn), aluminum (Al), tin (Sn), lead (Pb), and chromium (Cr) may be used as a metal material of the copper alloy, but the present invention is not limited thereto.

According to an embodiment of the present invention, a ratio of the thickness of the first layer 23a, the first electrode layer, to the thickness of the first electrode or the second electrode may be 3% to 30%, and the ratio of the thickness of the second layer 23b, the second electrode layer, to the thickness of the first electrode or the second electrode may be 70% to 97%.

When the thickness of the first electrode layer, the first layer 23a, is less than 3% of the thickness of the entire electrode, adhesive strength between the electrode and the piezoelectric body may be may be degraded, and when the thickness of the first electrode layer, the first layer 23a, is more than 30% of the thickness of the entire electrode, the difference in the thermal expansion coefficient between the electrode and the piezoelectric body may be increased to increase the frequency change rate due to a reflow.

When the thickness of the second electrode layer, the second layer 23b, is less than 70% of the thickness of the entire electrode, the thickness of the electrode using copper (Cu) or a copper alloy having low resistivity may be relatively reduced, increasing the ESR. Then, in order to lower a resistance value, the film thickness should be increased to 0.5 μm or greater, resulting in an increase in the manufacturing cost and degradation of the frequency characteristics of the piezoelectric resonator.

Also, when the thickness of the second electrode layer exceeds 97% of the thickness of the entire electrode, the frequency variation may be increased. For example, when two hours has lapsed after a reflow process, the frequency may be changed 6 ppm or greater, resulting in an increase in a time required for manufacturing a product and degradation of the reliability of the product.

Thus, in order to secure frequency stability of 5 ppm or smaller, the ratio of the thickness of the second electrode layer is required to range from 70% to 97% with respect to the overall electrode thickness. When the ratio of the thickness of the second electrode layer is within the foregoing range, the entire electrode may be formed within a thickness range of 0.15 μm to 0.4 μm, but the present invention is not limited thereto.

According to an embodiment of the present invention, in case of the piezoelectric resonator having the dual-layered type electrode structure, in particular, the thickness of the first layer 23a may be 3% to 15% of the thickness of the first electrode or the second electrode, and the thickness of the second layer 23b may be 85% to 97% thereof.

In the piezoelectric resonator having the dual-layered type electrode structure, when the thickness of the second layer 23b is 85% or greater of the thickness of the first electrode or the second electrode, the thermal expansion coefficient between the piezoelectric body 21 and the first electrode or the second electrode may be significantly reduced.

According to another embodiment of the present invention, a piezoelectric resonator may have a multi-layered electrode structure.

In the case of the piezoelectric resonator having a multi-layered structure according to an embodiment of the present invention, the piezoelectric body may have a stacking structure in which the first and second electrode layers are repeatedly stacked in an alternate manner on the main surface thereof.

The piezoelectric resonator may have a structure in which a dual-layered type electrode structure is repeatedly stacked two or more times, and may include a plurality of first electrode layers formed of at least one material selected from the group consisting of chromium (Cr), nickel (Ni), titanium (Ti), and alloys thereof. Also, the piezoelectric resonator may include a plurality of second electrode layers formed of copper (Cu) or an alloy including copper (Cu). The piezoelectric resonator may have a structure in which a plurality of first electrode layers and a plurality of second electrode layers are alternately stacked.

The ratio of the thickness of the plurality of first electrode layers may be 3% to 30% of the thickness of the first electrode or the second electrode, and the ratio of the thickness of the plurality of second electrode layers may be 70% to 97% of the thickness of the first electrode or the second electrode.

In the case of the piezoelectric resonator having the multi-layered electrode structure, adhesive strength between the first electrode 32a or the second electrode 32b and the piezoelectric body 31 may be further enhanced. Also, since the layers having a relatively small thermal expansion coefficient are repeatedly interposed, the difference in the thermal expansion coefficient between the electrode and the piezoelectric plate may be further reduced.

Accordingly, the piezoelectric resonator whose frequency change rate according to the reflow is further reduced can be provided.

With reference to FIG. 3, the piezoelectric resonator having a quadruple-layered electrode structure may include a piezoelectric body 31 oscillated according to an electrical signal and a first electrode 32a and a second electrode 32b which respectively include first and second electrode layers sequentially stacked on respective both surfaces of the piezoelectric body 31.

The first electrode layer may include a first layer 33a and a third layer 33c each including at least one material selected from the group consisting of chromium (Cr), nickel (Ni), titanium (Ti), and alloys thereof, and the ratio of the thickness of the first electrode layer to the thickness of the first electrode or the second electrode may be 3% to 30%.

The second electrode layer may include a second layer 33b and a fourth layer 33d each including copper (Cu) or an alloy including copper (Cu), and the ratio of the thickness of the second electrode layer to the thickness of the first electrode or the second electrode may be 70% to 97%.

Namely, the piezoelectric resonator according to an embodiment of the present invention may have a quadruple-layered electrode structure in which the first layer 33a, the second layer 33b, the third layer 33c, and the fourth layer 33d are sequentially stacked on the surface of the piezoelectric body 31 to form the alternately stacked first and second electrode layers.

In applying the electrode structure including the electrode layers formed of copper (Cu) or an alloy including copper (Cu) to the piezoelectric resonator or an oscillator, the third layer 33c may be further provided in order to compensate for the thermal expansion coefficient between the layer including copper (Cu) or an alloy including copper (Cu) and a heterogeneous material. Accordingly, the piezoelectric resonator having the quadruple-layered type electrode structure may be manufactured.

The first layer 33a and the third layer 33c, constituting the first electrode layer, serve to enhance the adhesive strength between the piezoelectric body 31 and the first electrode or the second electrode, and may be formed of at least one material selected from the group consisting of chromium (Cr), nickel (Ni), titanium (Ti), and alloys thereof. In particular, when chromium (Cr) or nickel (Ni)-chromium (Cr) is used, thermal stress between the electrode layer and the piezoelectric body may be reduced while securing excellent adhesive strength therebetween.

The first layer 33a and the third layer 33c may be formed of the same electrode material to thus reduce the thickness of the second layer 33b electrode and precisely compensate for the difference in the thermal expansion coefficient between the piezoelectric plate and the second layer electrode.

Accordingly, a generation of a frequency variation otherwise caused by thermal impacts during a process and thermal stress generated in a reflow for mounting a client's product can be prevented.

The ratio of the thickness of the first electrode layer including the first layer 33a and the third layer 33c may be 3% to 30% of the thickness of the first electrode or the second electrode. When the thickness of the sum of the first layer 33a and the third layer 33c is less than 3%, the adhesive strength between the electrode and the piezoelectric body may be degraded.

When the thickness of the first layer 33a and the third layer 33c is relatively too small, the adhesive strength between the electrode and the piezoelectric plate may be degraded, while when the thickness of the first layer 33a and the third layer 33c is relatively too great, a resistance and impedance value may be increased to above an allowable value (or tolerance). An appropriate composition and thickness may vary depending on the design of products, and the reference may be adjusted according to the thickness of the second layer and the fourth layer.

In more detail, the first layer 33a in contact with the piezoelectric plate can supplement the difference in the thermal conductivity and thermal expansion coefficient between the conductive material constituting the electrode and the piezoelectric plate, and strengthen the adhesive strength between the piezoelectric plate and the conductive material of the second layer electrode.

The third layer 33c may supplement the difference in the thermal conductivity and the thermal expansion coefficient between the conductive materials of the second layer 33b and the fourth layer 33d to thus strengthen the adhesive strength between the conductive materials of the second layer electrode and the fourth layer electrode. The third layer 33c may be formed of the same material as that of the first layer 33a in terms of productivity.

The second layer 33b and the fourth layer 33d may serve to provide electrical conductivity and reduce the difference in the thermal expansion coefficient between the piezoelectric body 31 and the first electrode or the second electrode. To this end, the second layer 33b and the fourth layer 33d may be formed of copper (Cu) or an alloy including copper (Cu), and the ratio of the thickness of the second electrode layer including the second layer 33b and the fourth layer 33d to the first electrode or the second electrode may be 70% to 97%.

When the second layer 33b and the fourth layer 33d are formed of a copper alloy, a metal material not reducing the conductivity of the copper itself may be used as an additional material of the copper alloy. For example, any one selected from the group consisting of gold (Au), manganese (Mn), nickel (Ni), zinc (Zn), aluminum (Al), tin (Sn), lead (Pb), and chromium (Cr) may be used as a metal material of the copper alloy, but the present invention is not limited thereto.

According to an embodiment of the present invention, the second layer 33b may be 17% to 80% of the overall electrode thickness. When the thickness of the second layer 33b is less than 17% of the overall electrode thickness, the resistance value may be drastically increased and its function as an electrode may be weakened. When the thickness of the second layer 33b exceeds 80% of the overall electrode thickness, an impedance value may be increased to above an allowable value.

The fourth layer 33d, the outermost layer, may be formed of a copper (Cu) or an alloy including copper (Cu), and may have a thickness of 17% to 80% of the overall electrode thickness. In the case of the fourth layer 33d, it may be properly trimmed to facilitate a frequency control and may have an oxidation resistance.

In a case in which the thickness of the fourth layer 33d is less than 17% of the overall electrode thickness, when a frequency is adjusted after the thin film is deposited, a portion of the film may be etched to expose the third layer 33c or even the third layer 33c may be etched to cause the frequency characteristics to be unstable in adjusting the frequency.

Also, according to an embodiment of the present invention, the second electrode layer may be comprised of the second layer including copper (Cu) or an alloy including copper (Cu) and a fourth layer including silver (Ag) or an alloy including silver (Ag). In the case of the fourth layer 33d, any one selected from the group consisting of silver (Ag) and an alloy including silver (Ag), which has excellent etching characteristics with argon (Ar), excellent oxidation resistance, and excellent bonding characteristics, may be used.

According to an embodiment of the present invention, copper (Cu) or an alloy including copper (Cu) may be used as a material of the second layer 23b of the dual-layered type electrode structure (FIG. 2) and the second layer 33b and the fourth layer 33d of the quadruple-layered type electrode structure (FIG. 3). Since copper (Cu) or an alloy including copper (Cu) is used, the manufacturing cost can be reduced and the frequency change rate can be lowered.

In particular, when copper (Cu) is used, a rapid degradation of electrical conductivity due to alloying can be prevented, an electrode having excellent electrical conductivity may be implemented. Also, since pure copper (Cu) is used as a material of the respective electrode layers, the electrode layers can be formed to be very thin. Accordingly, the characteristics such as ESR, or the like, may be implemented.

Also, when an alloy including copper (Cu) is used, the difference in the thermal expansion coefficient from the piezoelectric plate can be precisely adjusted.

In particular, in the case of using an alloy including copper (Cu), the ESR of the piezoelectric resonator and the thickness of the piezoelectric resonator are required to be adjusted by appropriately selecting a composition and a composition ratio of the alloy.

In the case of the piezoelectric resonator, when an electrode structure including a plurality of electrode layers is formed, the electrode layers are connected in parallel to form a single resistor.

According to an embodiment of the present invention, in the case of the piezoelectric resonator having the quadruple-layered electrode structure, when the resistance of the first layer is $R_1$, that of the second layer is $R_2$, that of the third layer is $R_3$, and that of the fourth layer is $R_4$, the resistance R of the electrode of the piezoelectric resonator may be expressed by an equation shown below:

$$\frac{1}{R} = \frac{1}{R_1} + \frac{1}{R_2} + \frac{1}{R_3} + \frac{1}{R_4}$$

In the alloy, as the content of copper (Cu) or silver (Ag) having relatively low resistivity is reduced, the resistance R becomes smaller. Namely, as the ratio of the thickness of the second layer or the fourth layer, constituting the second electrode layer including copper (Cu), is relatively increased, the overall electrode thickness of the piezoelectric body is relatively reduced and the electrode has a lower resistance value.

Meanwhile, when the ratio of the thickness of the second electrode layer including copper (Cu) is excessively increased, the adhesive strength with the substrate may be degraded. Then, the difference in the thermal expansion coefficient in the occurrence of thermal impacts may be increased. This would result in an increase in the frequency variation, so the thickness ratio of the second electrode layer is required to be appropriately adjusted.

In other words, in order to secure a low ESR and frequency stability, the thickness of the first electrode layer and the second electrode layer is required to be appropriately adjusted.

According to an embodiment of the present invention, in the case of the first electrode layer including copper (Cu), the content of copper (Cu) may be increased to relatively reduce the thickness of the electrode and enhance the frequency precision.

According to an embodiment of the present invention, in order to enhance the frequency precision, a trimming process may be performed to finely adjust frequency. The trimming process may be performed by etching the electrode surface by irradiating argon (Ar) ions, or the like, to the surface of the electrode such that the electrode film can have a thickness having a desired frequency. Here, when the degree of the alloy is relatively high, etching will not be easily performed. Thus, an alloy including one of the metals contained in alloy having a greater content may be used. Namely, an alloy including copper (Cu) or silver (Ag) which has a greater content may be used, but the present invention is not limited thereto.

In particular, in the case of the quadruple-layered electrode structure, in the surface mounting technology (SMT), the first electrode layer compensating for the thermal expansion coefficient may be again disposed on the third layer in order to significantly reduce a frequency variation due to thermal impacts applied in the reflow process. And, the second electrode layer is again stacked on the third layer.

In case of the overall thin film process, facilities such as a high vibration sputter, or the like, is used. Thus, as the thickness of the electrode is greater, the manufacturing cost and the manufacturing time are increased.

Thus, a composition and a composition ration of the copper alloy can be appropriately selected to secure frequency stability and have a relatively low resistance value while reducing the thickness of the electrode.

According to an embodiment of the present invention, any one selected from the group consisting of silver (Ag), gold (Au), manganese (Mn), nickel (Ni), zinc (Zn), aluminum (Al), tin (Sn), lead (Pb), and chromium (Cr) may be used as a metal alloyed with copper (Cu) in consideration of electrical conductivity of the electrode layer, a variation in the thermal expansion coefficient, oxidation reactivity, easiness of manufacturing a uniform thin film, and the like. In this case, the content of copper (Cu) may be 30% or less, or 60% or more.

When the content of copper (Cu) ranges from 30% to 60%, the resistance value may be increased according to alloying. Also, as the degree of alloying is increased, it may be difficult to adjust etching on the surface in the trimming process. In other words, a frequency distribution is increased in the etching process.

When the content of copper (Cu) is less than 60%, the electrical resistance value may be excessively increased and the difference in the thermal expansion coefficient from the piezoelectric plate may be increased. Thus, preferably, the content of copper (Cu) is 60% or more. Here, as the content of copper (Cu) is increased, resistance characteristics may be enhanced.

When the content of copper (Cu) is 30% or less, although there is a difference according to an alloy element, when a metal such as silver (Ag) or nickel (Ni) is used, a low resistance value may be obtained.

According to an embodiment of the present invention, the content of copper (Cu) may be 90% or more. This is because, when the content of copper (Cu) is 90% or more, electrical resistance of the electrode layer can be relatively reduced and the difference in the thermal expansion coefficient may be almost similar to the piezoelectric plate.

Alternatively, the content of copper (Cu) may be 30% or less. When zinc (Zn), nickel (Ni), aluminum (Al), manganese (Mn), chromium (Cr), and the like, is used, in a case in which the content of copper (Cu) exceeds 30%, the resistance value of the electrode layer may be changed and the electrode layer may be easily oxidized to form an oxidized film in alloying. When an oxidized film is formed, the resistance value of the electrode layer may be rapidly increased and so it is difficult to adjust the frequency, and the adhesive strength may be degraded.

In particular, when the content of copper (Cu) is 20% or less, the change in the thermal expansion coefficient may be reduced, the electrode layer may be prevented from being oxidized, and the predictability of the thermal expansion coefficient may become clear.

Figure 4:
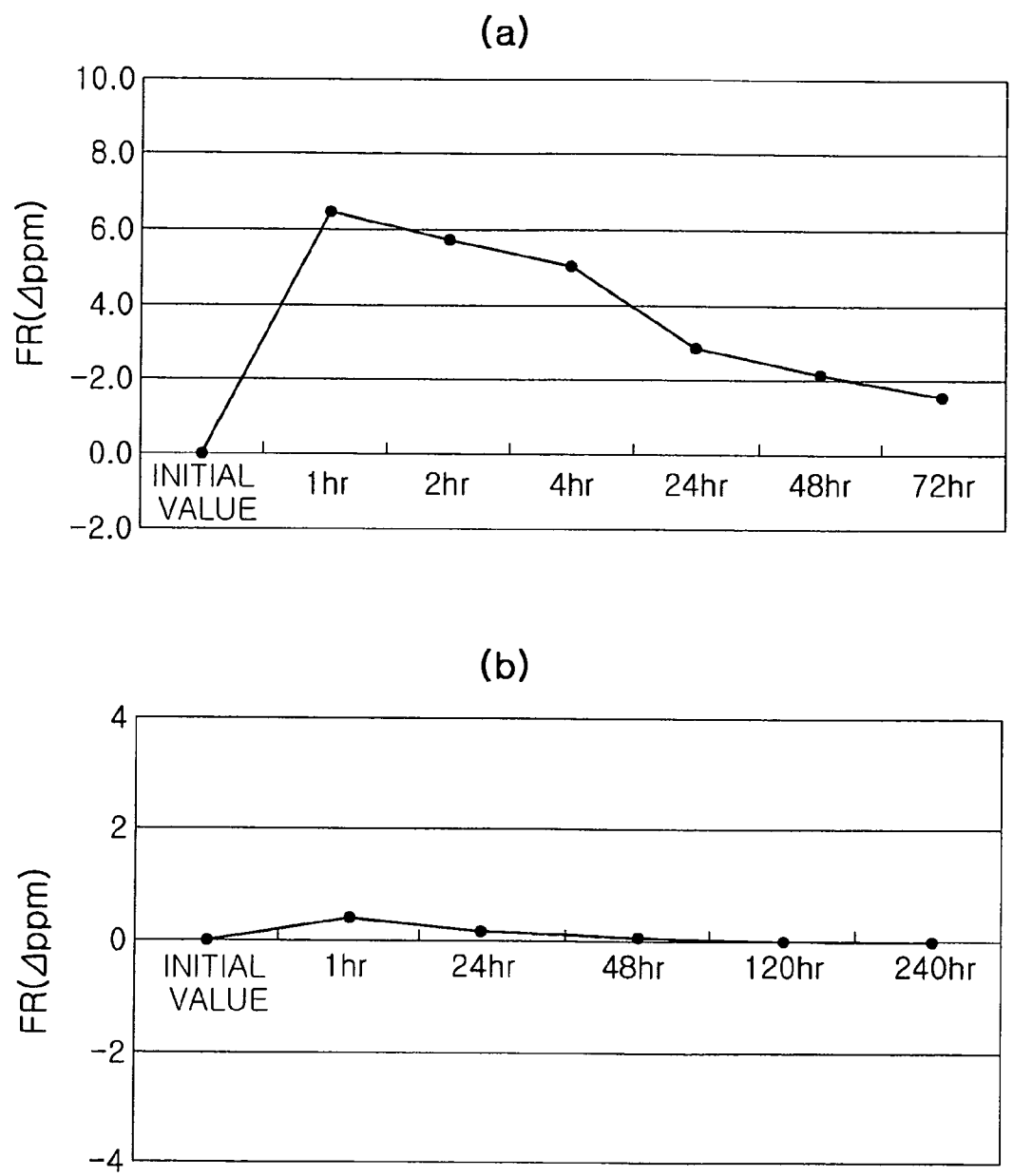
FIG. 4 is a graph comparatively showing reflow characteristics, over time, of a piezoelectric resonator employing an electrode structure according to a comparative example, and reflow characteristics, over time, of a piezoelectric resonator employing an electrode structure according to an embodiment of the present invention.

FIG. 4 is a graph comparatively showing frequency characteristics of the piezoelectric resonator employing the electrode structure manufactured according to an embodiment of the present invention, with the lapse of time after the reflow process, and a comparative example.

Comparative Example

In a comparative example, first and second electrodes were formed on upper and lower surfaces of a piezoelectric body. The respective first and second electrodes were manufactured to include a first layer formed of a nickel (Ni)-chromium (Cr) alloy and a second layer formed of silver (Ag).

With reference to FIG. 4(A), in the piezoelectric resonator according to comparative example, it is noted that a frequency variation has a value of 6 ppm or greater after a reflow process. Even after 72 hours, the changed frequency was not recovered to the original frequency, and the frequency variation was very great.

Embodiment

The piezoelectric resonator according to an embodiment of the present invention employed a quadruple-layered type electrode structure. In particular, the first and third layers were formed as nickel (Ni)-chromium (Cr) alloy layers, and the second and fourth layers were formed as copper (Cu) layers. In particular, the first layer was manufactured to have a thickness of 21 nm, the second layer was manufactured to have a thickness 188 nm, the third layer was manufactured to have a thickness 30 nm, and the fourth layer was manufactured to have a thickness 115 nm. The ratio of the thickness of the first layer to the overall electrode thickness was 5.9%, the ratio of the thickness of the second layer to the overall electrode thickness was 53.1%, the ratio of the thickness of the third layer to the overall electrode thickness was 8.4%, and the ratio of the thickness of the fourth layer to the overall electrode thickness was 32.5%

With reference to FIG. 4(B), it is noted that a frequency variation over time was less than 1 ppm. Also, it is noted that the frequency having the substantially same value as the initial value was continuously maintained after a reflow process.

As set forth above, according to embodiments of the invention, since the difference in thermal expansion coefficient between the piezoelectric plate and the electrode is significantly reduced, the piezoelectric resonator having a relatively small frequency variation according to thermal stress may be provided.

In addition, the use of a low-priced metal can reduce the manufacturing cost, and since the multi-layered electrode structure is simply formed, manufacturing efficiency may be enhanced.

Also, since a frequency variation over time is small, the piezoelectric resonator which can be applied to a product requiring high precision and high reliability may be manufactured.

While the present invention has been shown and described in connection with the embodiments, it will be apparent to those skilled in the art that modifications and variations can be made without departing from the spirit and scope of the invention as defined by the appended claims.

What is claimed is:

1. A piezoelectric resonator comprising:
a piezoelectric body oscillated according to an electrical signal; and
first and second electrodes each including first and second electrode layers stacked on respective both surfaces of the piezoelectric body,
the first electrode layer including at least one material selected from the group consisting of chromium (Cr), nickel (Ni), titanium (Ti) and alloys thereof, and the ratio of the thickness of the first electrode layer to the thickness of the first or second electrode being 3% to 30%; the second electrode layer including copper (Cu) or an alloy including copper (Cu), and the ratio of the thickness of the second electrode layer to the thickness of the first or second electrode being 70% to 97%.

2. The piezoelectric resonator of claim 1, wherein the alloy including copper (Cu) includes copper (Cu) and any one selected from the group consisting of gold (Au), manganese (Mn), nickel (Ni), zinc (Zn), aluminum (Al), tin (Sn), lead (Pb), and chromium (Cr).

3. The piezoelectric resonator of claim 1, wherein an atomic ratio of copper (Cu) to the alloy including copper (Cu) is 30% or less, or 60% or more.

4. The piezoelectric resonator of claim 1, wherein the atomic ratio of copper (Cu) to the alloy including copper (Cu) is 20% or less.

5. The piezoelectric resonator of claim 1, wherein the atomic ratio of copper (Cu) to the alloy including copper (Cu) is 90% or more.

6. The piezoelectric resonator of claim 1, wherein the first and second electrodes have a dual-layered electrode structure including a first layer formed of the first electrode layer and a second layer formed of the second electrode layer.

7. The piezoelectric resonator of claim 6, wherein the ratio of the thickness of the first layer to the thickness of the first or second electrode is 3% to 15%, and the ratio of the thickness of the second layer to the thickness of the first or second electrode is 85% to 97%.

8. The piezoelectric resonator of claim 1, wherein the respective first and second electrodes have a structure in which the first and second electrode layers are repeatedly stacked in an alternating manner.

9. The piezoelectric resonator of claim 1, wherein the first and second electrodes have a quadruple-layered electrode structure including first and third layers constituting the first electrode layer and second and fourth layers constituting the second electrode layer.

10. The piezoelectric resonator of claim 9, wherein the ratio of the thickness of the second layer to the thickness of the first or second electrode is 17% to 80%, and the ratio of the thickness of the fourth layer to the thickness of the first or second electrode is 17% to 80%.

11. A piezoelectric resonator comprising:
a piezoelectric body oscillated according to an electrical signal; and
first and second electrodes each including first and second electrode layers stacked on respective both surfaces of the piezoelectric body,
wherein the first electrode layer including first and third layers including at least one material selected from the group consisting of chromium (Cr), nickel (Ni), titanium (Ti), and alloys thereof, and the ratio of the thickness of the first electrode layer to the thickness of the first or second electrode being 3% to 30%; and the second electrode layer including a second layer including copper (Cu) or an alloy including copper (Cu) and a fourth layer including silver (Ag) or an alloy including silver (Ag), and the ratio of the thickness of the second electrode layer to the thickness of the first or second electrode being 70% to 97%.

12. An electrode structure of a piezoelectric resonator, the structure comprising first and second electrode layers stacked on main surfaces of a piezoelectric body, the first electrode layer including at least one material selected from the group consisting of chromium (Cr), nickel (Ni), titanium (Ti), and alloys thereof, and the ratio of the thickness of the first electrode layer to the overall electrode thickness being 3% to 30%; and the second electrode layer including copper (Cu) or an alloy including copper (Cu), and the ratio of the thickness of the second electrode layer to the overall electrode thickness being 70% to 97%.

13. The electrode structure of claim 12, wherein the electrode structure is a dual-layered electrode structure including a first layer formed of the first electrode layer and a second layer formed of the second electrode layer.

14. The electrode structure of claim 12, wherein the electrode structure is a structure in which the first and second electrode layers are repeatedly stacked in an alternating manner.

15. The electrode structure of claim 12, wherein the electrode structure is a quadruple-layered electrode structure including first and third layers constituting the first electrode layer and second and fourth layers constituting the second electrode layer.

16. An electrode structure of a piezoelectric resonator, the electrode structure comprising first and second electrode layers stacked on main surfaces of a piezoelectric body,
the first electrode layer including first and third layers including at least one material selected from the group consisting of chromium (Cr), nickel (Ni), titanium (Ti), and alloys thereof, and the ratio of the thickness of the first electrode layer to the overall electrode thickness being 3% to 30%; and the second electrode layer including a second layer including copper (Cu) or an alloy including copper (Cu) and a fourth layer including silver (Ag) or an alloy including silver (Ag), and the ratio of the thickness of the second electrode layer to the overall electrode thickness being 70% to 97%.

\* \* \* \* \*